United States Patent
Thomsen et al.

[11] Patent Number: 5,871,858
[45] Date of Patent: Feb. 16, 1999

[54] ANTI-THEFT BATTERY

[75] Inventors: Jes Thomsen, Copenhagen, Denmark; Tore Rehnberg, Nol, Sweden

[73] Assignee: Intra International AB, Sweden

[21] Appl. No.: 765,238
[22] PCT Filed: Jun. 21, 1995
[86] PCT No.: PCT/SE95/00767
§ 371 Date: Mar. 3, 1997
§ 102(e) Date: Mar. 3, 1997
[87] PCT Pub. No.: WO95/35228
PCT Pub. Date: Dec. 28, 1995

[30] Foreign Application Priority Data

Jun. 22, 1994 [SE] Sweden .................................. 9402216
Jun. 22, 1994 [SE] Sweden .................................. 9402217

[51] Int. Cl.⁶ .............................................................. H01M 2/34
[52] U.S. Cl. .................................. 429/7; 429/61; 429/62; 429/65; 327/403
[58] Field of Search .............................. 429/7, 61, 62, 429/65; 327/403

[56] References Cited

U.S. PATENT DOCUMENTS

| | | | |
|---|---|---|---|
| 4,067,041 | 1/1978 | Hutson ...................................... | 357/80 |
| 4,553,127 | 11/1985 | Issa ........................................... | 340/64 |
| 5,283,463 | 2/1994 | Nguyen et al. ........................... | 257/692 |
| 5,419,983 | 5/1995 | Suzuki et al. ........................... | 429/65 X |
| 5,496,654 | 3/1996 | Perkins .................................... | 429/7 X |
| 5,552,744 | 9/1996 | Burlison et al. ..................... | 327/403 X |
| 5,569,550 | 10/1996 | Garrett et al. ................................ | 429/7 |
| 5,652,538 | 7/1997 | Boudry et al. ............................ | 327/403 |

FOREIGN PATENT DOCUMENTS

| | | | |
|---|---|---|---|
| 0090439 A2 | 2/1983 | European Pat. Off. ......... | H01L 23/36 |
| 0161365 A2 | 11/1984 | European Pat. Off. ......... | B60R 25/04 |
| 2263012 | 1/1992 | United Kingdom .......... | H01M 10/42 |
| PCT/SE85/ 00234 | 6/1985 | WIPO ........................... | B60R 25/04 |
| PCT/US90/ 06632 | 11/1990 | WIPO ............................. | B60R 25/00 |
| PCT/GB/93/ 00225 | 2/1993 | WIPO ............................. | B60R 25/04 |
| PCT/NZ93/ 00009 | 2/1993 | WIPO ............................... | H02J 7/00 |
| PCT/GB93/ 01345 | 6/1993 | WIPO ............................ | B60R 25/10 |

OTHER PUBLICATIONS

The International Search Report for the corresponding international application no. PCT/SE95/00767.

The International Preliminary Examination Report for the corresponding international application no. PCT/SE95/00767.

*Primary Examiner*—Stephen Kalafut
*Attorney, Agent, or Firm*—Dergosits & Noah LLP

[57] ABSTRACT

In a battery such as a starter battery for a motor vehicle semiconductor switches such as MOSFET-switches (11) are connected in parallel between the middle battery cells (7, 9). The switches (11) are controlled by a processor (15) which can receive signals from the exterior, such as rf-signals received by a receiver (25), for allowing a high but not too high current for powering a starter motor from the battery. In other cases only small currents can be drawn from the battery for powering a clock, illumination, etc. The processor also monitors the charge state and can block also small currents when there is too little charge left whereby also a sufficient charge can be left for starting the motor. The switches (15) are located inside the battery in a conducting contact with a metal plate, which is mounted directly on a terminal of one of the middle battery cells and which can be mounted against a bent cooling flange. On the adjacent terminal of the other one of the central cells also a conducting plate may be mounted, which is isolated from the first plate. To this second plate, at areas located adjacent to an edge next to the first plate, the switches (11) are connected electrically through connection wires. For an interrupt in a lead to a power supply unit it can be provided with voltage from a reduced number of battery cells. Therefore, suitably placed diodes are provided in the interior supply lines to the power supply unit.

26 Claims, 8 Drawing Sheets

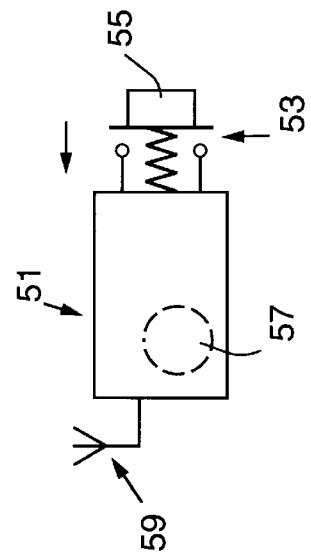
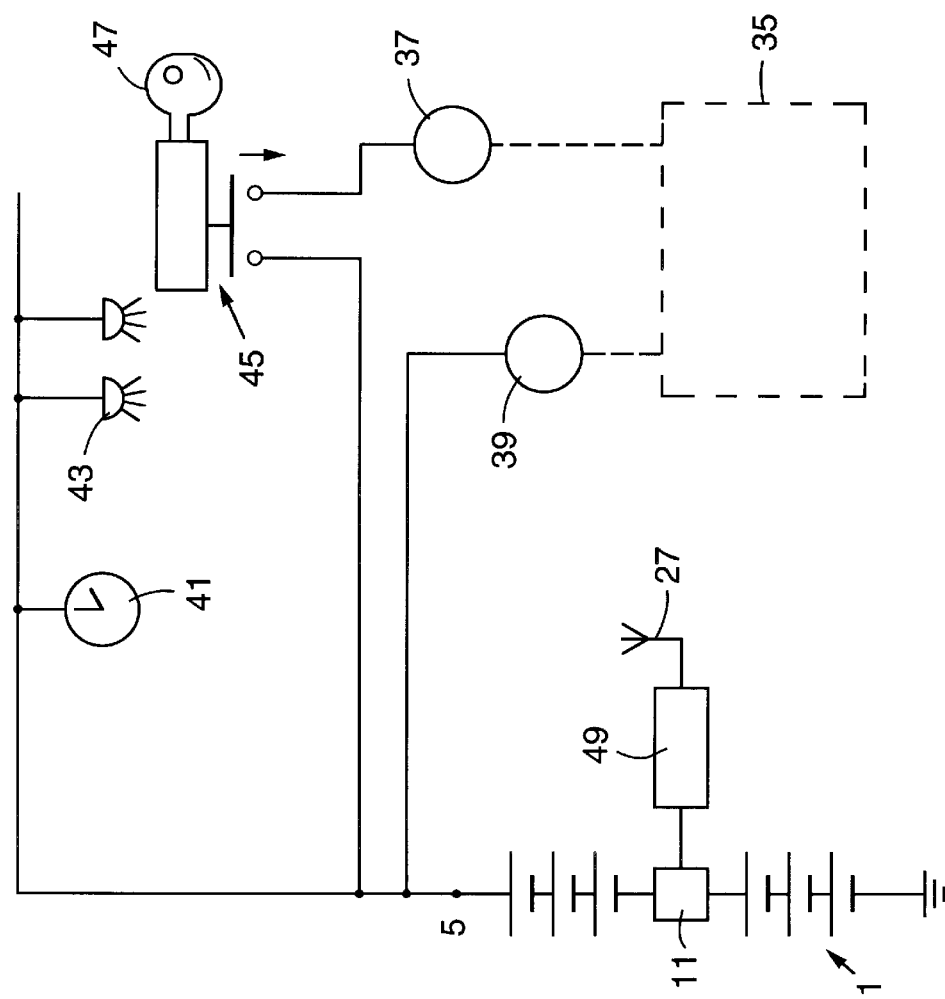
FIG. 2

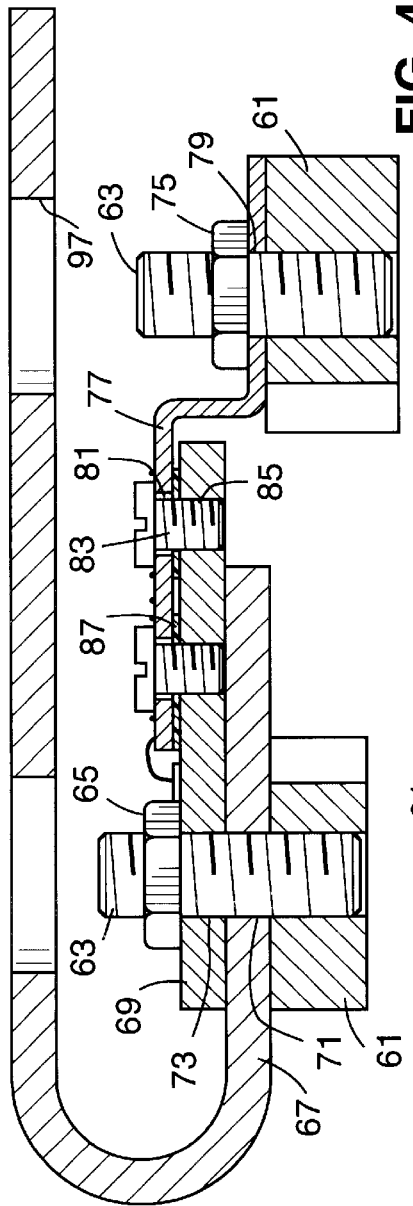
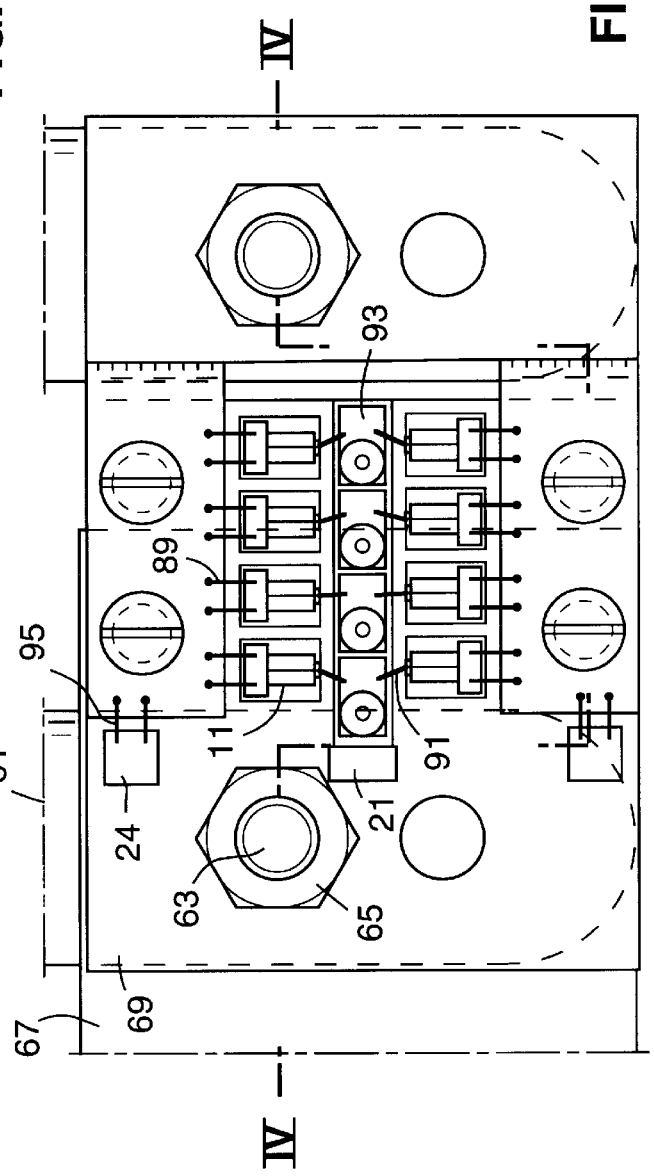
FIG. 4
FIG. 3

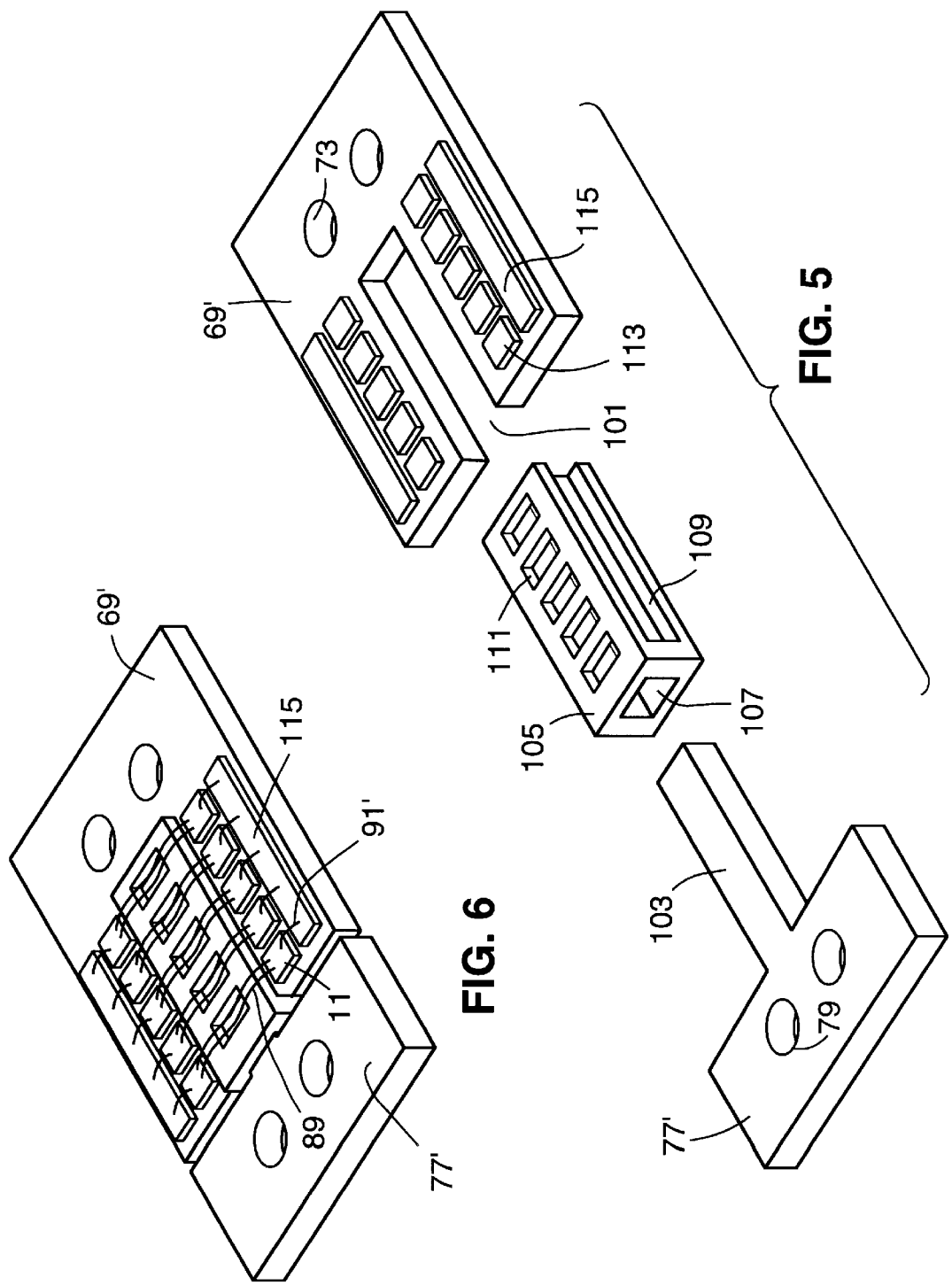

ANTI-THEFT BATTERY

TECHNICAL FIELD

The present invention relates to an anti-theft battery and in particular to a switch device to be used for instance in such a battery.

BACKGROUND

Motor vehicles having internal combustion engines are most often started by means of an electrically powered starter motor which obtains its powering current from a battery which conventionally comprises several electrolytic battery cells containing plates submerged into an electrolyte. The battery is connected to the starter motor by means of a switch in an ignition lock which is switched on at turning a key.

It is however relatively difficult to protect such a conventional system against theft since the switch in the ignition lock can be by-passed in a simple manner. There is thus a need for alternative ways of protecting motor vehicles against theft. A possibility therefor is arranging an anti-theft device directly in or at the battery as will be apparent from the discussion below.

PRIOR ART

The published British patent application GB-A 2263012 for David John Cuckow et al. discloses an anti-theft battery comprising an electrical switch 2, S placed inside the battery vessel 8 below the level of the electrolyte 6.

The U.S. Pat. No. 5,023,591 for Allen V. Edwards and the corresponding published International patent application WO-A1 91/07297 disclose anti-theft control apparatus using a silicon controlled rectifier connected between two cells in a motor vehicle battery. The SCR will only conduct electrical current between the cells when it has received an appropriate signal on its gate electrode. The SCR is connected to upstanding yoke members 40 connected to the plates of the cells.

The published International patent application WO-A1 93/15935 for Northlynn Limited/Richard David Harwood discloses an anti-theft system comprising a motor vehicle battery having a built-in remotely-operated switch to interrupt or limit current flow between one of the battery terminals and the battery cells. A temperature sensor 45 may be used to protect the battery from overcharging and can provide a signal of an excessive temperature in the battery for disconnecting the battery.

The U.S. Pat. No. 4,798,968 for James R. Dean, U.S. Pat. No. 4,958,084, U.S. Pat. No. 5,184,023, both for Louis D. Carlo et al., and the published European patent application EP-A2 0 161 365 for Mr. Gasket Co. which corresponds to the last two patents, disclose anti-theft devices for attachment to a battery. The current through a motor vehicle battery can be monitored and switched off when a substantial amount of current is drawn from the battery such in an attempt to start the vehicle.

The published International patent application WO-A1 94/01894 for B.I.G. Batteries Limited/Peter Philip Gatehouse discloses a security battery for motor vehicles comprising an electronic circuit board 8 comprising a control circuit arranged inside the lid of the battery, above an interior lid 11 placed above the cells.

The published European patent application EP-A2 0 163 822 for Sociedad Espanola del Acumulador Tudor, S.A., discloses an electrical starter battery comprising electronic circuits arranged in a lid of the battery.

From the published European patent application EP-A1 0 448 755 for Anton/Bauer, Inc., an intelligent battery system is previously known which senses electrical current which flows in the direction of the charging current through the positive and negative terminals and the battery cells. As a response thereto a processor inside the battery transfers parameter data for the battery to a separate signal output from the battery.

Similar systems are disclosed in U.S. Pat. No. 4,553,081 and U.S. Pat. No. 4,555,523 for Koenck where also methods for estimating the remaining capacity of a battery are described.

In U.S. Pat. No. 4,289,836 for Jerome H. Lemelson a rechargeable battery is disclosed which is provided with a microprocessor for delivering signals which control the charging of the battery.

DESCRIPTION OF THE INVENTION

It is an object of the invention to provide a switch device having a good thermal dissipation.

It is a further object to provide an advantageous mounting of a switch device/interrupter inside a battery allowing a good thermal dissipation from primary switch elements.

It is a further object to provide an anti-theft battery having semiconductor switches which are protected against overvoltages and overtemperatures.

It is a further object to provide a motor vehicle battery having intelligence for providing small currents in a standby or locked state for a good charge condition but not allowing even small currents to be drawn for a bad charge condition, except for providing current to a starter motor of the vehicle.

It is a further object to provide an anti-theft battery, by means of which also short circuits in an electrical system, to which the battery is connected, can be rendered harmless.

It is a further object to provide a current supply for control circuits for an anti-theft battery, which provides security also for interrupts in conductor connections.

The objects mentioned are achieved by the invention, the characteristics and features of which appear from the following description and the appended claims.

In a battery such as a starter battery for a motor vehicle comprising several battery cells which are connected in series one or more primary switches are arranged, preferably semiconductor switches such as power-transistors or advantageously MOSFET-switches, which are connected in parallel to each other. They are connected between the middle cells of the battery or generally between groups of cells, where otherwise a serial connection would be arranged. The switches are controlled by a processor and it can receive signals from the outside, such as rf-signals comprising identifying pulses, issued by a hand held transmitter and received by a receiver, for allowing that a large current for powering the starter motor is drawn from the battery. Otherwise only small currents can be drawn from the battery for powering other apparatus such as clock, illumination, etc. Thereby also a protection is obtained against short circuits in the electrical system of the vehicle, since the processor all the time measures the current through the battery and switches off the semiconductor switches in the case where the current will become too high. It will also protect the starter motor against too high currents. The processor further checks the temperature of the switches by means of a temperature sensor, so that the switches block the discharge from the battery and also charging when their temperature becomes too high. The switches are placed inside the battery in a conducting contact with a metal plate which is directly attached to a terminal of one of the middle battery cells and which can be arranged against a bent cooling fin or flange. To the adjacent terminal of the other of the middle cells also a conducting plate can be attached which is isolated from the first plate. To this second plate, at areas adjacent an edge facing the first plate, the primary switch or switches are connected electrically through soldered or bonded coupling wires.

Thus generally, an electrically controlled switch device, which can be used for various purposes as a heavy duty switch, e.g. in motor vehicles and in particular to be incorporated in a motor vehicle battery, comprises two electrical terminals and at least one semiconductor switch. The switch or switches are generally plate-shaped and comprise each one a main part or body and have one electrical terminal located on a large bottom side and another electrical terminal located on another side of the body. A first electrically and thermally conducting plate-shaped member such as a metal plate comprises a large surface or side and the main parts or bodies of the switch or switches are mounted in a line or a row on this side of the member, so that the bottom side or sides are in an electrical and intimate thermal contact with the large side of the member, which can be achieved by soldering. A second electrically conducting plate-shaped member, suitably also a metal plate, comprises two large sides and an edge connecting the large side. The edge extends in parallel to the line of the switches and at one side of the switches. The second member is arranged to form a gap between the first and second members, where this gap has an essentially constant width over its length. The first and second members are then the electrical terminals of the switch device. Electrical connection leads extend between the terminals located at the other sides of the switches and the second member.

In particular, the edge of the second member may be located above an inner portion of the large side of the first member, so that the gap is formed between a bottom side of the second member and the large side of the first member.

Alternatively, the edge of the second electrically conducting plate-shaped may extend in parallel to and adjacent at least that portion of the edge of the first member, at which the switches are mounted, so that a gap is formed between the parallel portions of the edges. Then a large side of the second member can be located in the same plane as a large side of the first member. Also, the thickness of the second member is then preferably essentially equal to the thickness of the first member and the plates extend in essentially the same plane.

The second member comprises advantageously two parallel edges, each of one of which is parallel to a line of switches and is located at small sides of the switches. The switch device can comprise two groups of switches, a first and a second group, where each group contains at least one switch. Then a straight line passes through the switches of each group and an edge of the second member extends in parallel to each such line. This edge is located at the switches of the respective group, directly at small sides of the switches.

A strip of an electrically isolating material, that has electrically conducting areas thereon, may be located between the lines through the switches and between the switches, so that electrical leads can extend between control terminals on the switches and these conducting areas. Each primary switch in one group is the advantageously located opposite a primary switch in the other group, so that each switch in the first group is included in a pair of adjacent switches, where the other switch is comprised in the second group. Such a pair of switches can have their control terminals connected to each other.

One of the plates can have a U-shape, so that two parallel edges are formed at the inner sides of the legs of the U, where the switches are arranged. The other one of the plats can then have a projecting portion which protrudes between the legs of the U-shape of the other member. This portion then comprises two parallel edges, at which the switches are arranged.

The gap between the plate can be filled with an electrically isolating material, in particular a plastics or ceramics material, for enhancing the mechanical stability of the switch device. Thus, a sleeve of an isolating material, in particular a plastics or ceramics material, can enclose a portion of the second member and thereby filling the gap. The sleeve comprises advantageously apertures at one side thereof to permit access to a large side of the second member for connection of electrical leads.

For providing an increased heat dissipation, the first plate can be prolonged by a cooling flange and in particular the cooling flange can be a separate plate which at one of its sides is in thermal contact with a large side of the first plate. The cooling flange is, for reducing or optimizing the space used by the switch device, bent or curved so that it will have a portion which is located above the switches.

For a switch arranged inside a battery which as conventional has cells, each one comprising positive and negative battery plates, which are connected to by a connector strap to form a terminal of the cell, the first plate-shaped member may, also for provide a possibility for heat dissipation and for simplifying the arrangement, be in an electrical and intimate thermal contact with such a terminal of a battery cell. The terminal with which the plate is in contact has then preferably an upstanding portion, a pole post, which is prolonged by a pole piece extending to the side, in parallel to the upper edges of the battery plates. The terminal with which the plate is in contact has also a substantially flat top surface, on which the plate is mounted, for enhancing the thermal contact.

For a battery having a controlled semiconductor switch device therein, one or several diodes may as conventional be connected in parallel to the semiconductor switches and then they should have such a polarity that they, when the battery is charged from an exterior voltage source, will become forward-biased and let current through, but that they in normal use of the battery for powering exterior devices will become reverse-biased and block the current therethrough, which then flows only through the semiconductor switches. For protecting the semiconductor switches, the diodes are preferably zener-diodes having a breakthrough voltage, which exceeds the normal voltage drop over the semiconductor switches, when they are in a conducting or blocking state.

A battery as above, including electrically controllable switches, in particular semiconductor switches, connected between two adjacent cells in the battery, has, also for protection of the switches, a first temperature sensor arranged adjacent to or in the vicinity of the switches. The signal from the sensor is used by a control unit for switching off the controllable switches for signals indicating a too high temperature. The sensor may be attached thermally to a thermally conducting plate as described above, comprising a large side, the main part or body of the switches being attached to this side, so that a bottom side of the switches is in an intimate thermal contact with the side of the member. A second temperature sensor can be arranged at some distance from the switches for providing a signal to the control unit, so that it can block current through the battery for too high overall temperatures of the battery.

For a motor vehicle battery as above, comprising an electrically controllable switch device connected in series with the battery, the battery being connected to a starter motor of the motor vehicle and to other electrically driven apparatus, a control unit is connected to switch device. The control unit is arranged to measure the magnitude of the electrical current, which passes through the battery, and/or the voltage over outermost terminals of the battery, for determining therefrom the remaining charge of the battery. It controls the switch device to a blocking state blocking all currents drawn from the battery, in the case where the determined remaining charge is lower than a first threshold value. This value is chosen so that the battery then will always have a sufficient charge for driving the starter motor during a sufficiently long time period which can be required for starting the motor of the vehicle.

As conventional, the control unit can in same way receive a code signal and then it to controls the switch device to a conducting state at reception of the signal or generally dependent on the received signal. Then normally the motor is started and for protection of the starter motor, the control unit can then measure, when it controls the switch device to a conducting state after receiving the code signal, the magnitude of the electrical current, which passes through the battery, and command again the switch device to a blocking state in the case where the measured electrical current exceeds a first threshold value.

The battery can normally allow a small current to be drawn by arranging that the control unit measures, when it has not received the code signal, the magnitude of the electrical current, which passes through the battery, and commands again the switch device to a blocking state in the case where the measured electrical current exceeds a second threshold value, which is much lower than the first threshold value, the first threshold value usually being several hundreds of Amperes and the second threshold value only a few Amperes.

In order to provide a secure power supply for the electrical control circuit it can be connected through first electrical conductors to the external terminals of the battery but also through second electrical conductors to those terminals of adjacent cells to which the switch or switches are connected. Then diodes are connected in the first and second conductors having such a polarity, that when all conductors are whole or intact or there is an interrupt in one of the other electrical conductors, the control circuit obtains its power supply from the external terminals of the battery, i.e. in the normal case, but if the switch is in a blocking state the control circuits obtains its power supply from the groups of battery cells, which are then separated from each other, and if an interrupt is obtained in a first conductor to an external terminal, which obviously normally is rather long, the control circuit obtains its power supply from those battery cells which are located between the other external terminal and the switches. Of course, also the power supply for the control circuit could also be permanent from cells within such a group, but it would give an uneven load on those cells, considering the fact that a starter battery during most of the time does not supply any current or only a low current.

In order that the control circuits in the battery shall not draw current from the battery when e.g. storing the battery before the actual delivery to a user, the feeder line to a power supply unit incorporated in the control circuits can have an interrupt which is closed manually when the battery is used. Therefor the feeding line can pass through a connection bridge or jumper, which is available from the outside and which is removed when the battery is to be stored.

DESCRIPTION OF THE DRAWINGS

The invention will now be described in more detail and with reference to a non-limiting embodiment and with reference to the accompanying drawings in which:

FIG. 2 is a schematic picture of some essential parts of the electrical system of a motor vehicle and a hand-held transmitter, FIG. 3 is a view from above of metal plates to which switches are mounted/connected, FIG. 4 is a sectional view along the line IV—IV in FIG. 3, FIG. 5 is an exploded perspective view of another embodiment of the metal plates of FIG. 3, FIG. 6 is a perspective view of the plates of FIG. 5 mounted at each other and with attached switches.

DESCRIPTION OF PREFERRED EMBODIMENTS

Figure 1:
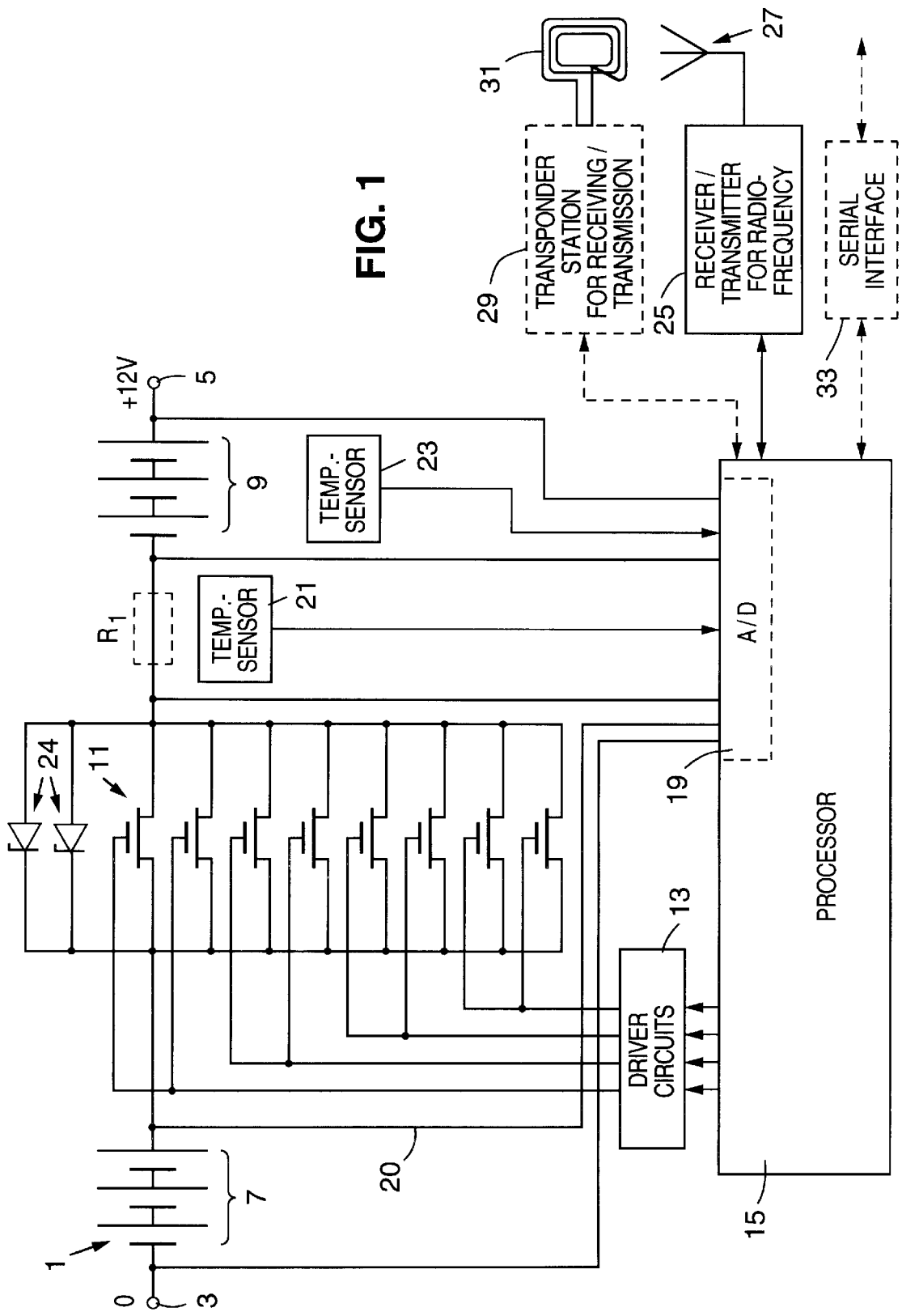
FIG. 1 is a circuit diagram illustrating the principles of an anti-theft device arranged inside a battery.

FIG. 1 is a circuit diagram of an anti-theft device for a battery which in the preferred case is a starter battery for a, motor driven vehicle or another motor driven vessel or device but it may also be e.g. a stationary battery. The battery contains in the case shown six cells indicated symbolically at 1 which are all connected in series. For a lead-acid battery then, between the negative exterior or outermost terminal 3, which conventionally is coupled to ground or the chassis/body of the vehicle, and the positive negative exterior or outermost terminal 5 a voltage of +12 V is obtained. The cells are grouped in or divided into two groups, a lower group 7 including three cells, of which the outermost cell has its negative terminal identical to the exterior negative terminal of the entire battery, and a higher group 9 also including three cells, of which the outermost cell has its positive terminal identical to the positive terminal of the battery.

Between the two cell groups 7 and 9 a number of semiconductor switches 11, in the case illustrated 8 switches, are connected but also only one switch can be used in the case where it alone can stand the high discharge currents. They can be transistors of MOSFET-type and they are all connected in parallel having their emitter or source terminal connected to a cell in the higher cell group 9 and their collector or drain terminal connected to a cell in the lower group 7. The semiconductor switches 11 have their gates connected two and two to each other and these are connected to driver circuits 13 which in turn are controlled by signals from a processor 15. The semiconductor switches 11 are connected so that for a nonexistent signal from the processor 15, e.g. when it does not obtain any current supply, they are in a blocking state. Thereby no current can be drawn from the battery e.g. in the case where some malfunction exists in the electronic control circuits or in the case where they do not obtain any operating voltage. Such a behaviour is simple to achieve, since semiconductor switches for entering a conductive state needs some voltage on or current to their gates.

The processor 15 also contains an A/D-converter 19 for receiving signals, which are evaluated by calculating circuits of the processor for a control of the semiconductor switches through the signals provided to the driver circuits 13. For measuring the current through the battery a small resistor $R_1$ may be connected in series between two cells, e.g. as is illustrated in FIG. 1 between the semiconductor switches 11 and the lowest cell in the higher group 9 of cells. Electrical leads on both sides of the resistor $R_1$ can then pass to the A/D-unit 19. However, the resistor $R_1$ consumes electrical power besides the electrical power developed by the switches 11 when they are in a conducting state. Therefore, it is more advantageous to omit the resistor $R_1$ and instead use the inner resistance of the switches 11 in the conducting state thereof for measuring the current through the battery. It presupposes that this resistance is constant and/or has a well-known behaviour, for example having a well-known temperature dependence, and this resistance can be determined e.g. at the actual connection procedure of the processor to the battery. In that case also, one lead on one side of the resistor $R_1$ is omitted and is replaced with a lead 20 from the opposite electrode of the semiconductor switches 11, so that leads extend to the A/D-unit 19 of the processor 15 from both sides of the switches 11.

Furthermore, a first temperature sensor 21 is placed in the vicinity of the semiconductor switches 11 and provides a signal to the A/D-unit 19 of the processor 15. A similar temperature sensor 23 is placed at a larger distance from the semiconductor switches 11 but still inside the battery for providing a signal to the processor 15, which represents the temperature of the battery. Finally, also lines or leads are provided from the exterior terminals 3 and 5 of the battery to the A/D-converter 19 enabling a measurement of the battery voltage.

One or more zener diodes 24, in the case shown two diodes, are connected in parallel to each other and to the semiconductor switches 11. They are connected with their positive electrode to that side of the semiconductor switches 11 which faces the positive terminal 5 of the battery. They have a zener voltage adapted for protecting the semiconductor switches 11. Thereby no current will pass through the diodes 24 at normal use but they will become conducting when the battery is charged and also for overvoltages over the semiconductor switches, which can occur when the switches 11 are in a conductive or blocking state and can then damage the semiconductor switches 11.

The processor 15 and other circuits which require a current supply for their operation, obtain their energy from e.g. some suitable small separate dry cell battery, not shown, or from the battery itself such as from its exterior terminals 3 and 5 connected to a current supply unit as will be described with reference to FIG. 10. The processor 15 can be of low power type having special current saving functions, which sets the processor in a low-power mode when no activity exists or no changes exist in the signals delivered to the processor 15.

The processor 15 is further coupled to some device for wireless information communication, in the preferred case a receiver 25 for radio frequency, which possibly can be combined with a transmitter unit. The receiver and also possibly transmitter 25 is connected to an antenna indicated at 27.

Instead of the radio frequency receiver 25 alternatively a transponder station 29 for use together with an exterior, portable miniaturized transponder, not shown, such e.g. is manufactured by Texas Instruments under the name "TIRIS", can be used instead of a battery operated hand-held transmitter 51, see FIG. 2, which is intended to cooperate with the receiver/transmitter 25. The transponder station 29 is provided with a specially constructed antenna 31 comprising several winding turns and operating as a winding in a transformer. The second winding of this transformer, not shown, is located in the transponder which is normally carried by the owner or the driver of the vehicle where the battery is placed. When the antenna winding 31 is activated for transmitting high frequency pulses of e.g. 100–200 kHz a voltage is induced in the transponder winding which voltage causes a current therein, whereby the high frequency energy in the received pulses can be stored in a capacitor in the transponder, which is then used for powering electronic circuits in the transponder. By means of pulse bursts of various length issued from the antenna winding of the transponder information can be transferred to the transponder station 29 which decodes the received pulse bursts and then communicates the retrieved information to the processor 15. The transponder station 29 can also be used for transmitting information to the transponder.

The processor 15 can also be designed for communication through electrically conducting wires, e.g. for communication with a charging generator for the battery and therefor a serial interface 33 of a conventional kind can be connected to the processor 15.

FIG. 2 is a diagram illustrating how the battery including the cells 1 can be arranged in a motor vehicle, not shown, which is driven by an internal combustion engine 35. From the plus terminal 5 of the battery leads pass to a starter motor 37, a generator 39 and other electrically powered devices such as a clock 41, illumination 43, etc. The line to the starter motor 37 is interrupted by a key switch 45 which is normally open but is closed when turning a key 47, whereby current is supplied to the starter motor 37. The key switch 45 can also close an electrical circuit to the ignition system.

The semiconductor switches 11 are here shown in the shape of a single block and they are controlled by the control circuits 49 which include the electronic components illustrated in FIG. 1 except the semiconductor switches 11. The antenna 27 is here shown as connected to the control circuits 49 which also include the rf-receiver 25.

A hand-held transmitter 51 comprises transmitter circuits, not shown, a switch 53 which is closed by depressing an operating button or key 55, a small electro-chemical battery indicated at 57, e.g. a lithium battery, and an antenna 59. When the key 55 is depressed, electromagnetic radio waves are emitted from the antenna which contain identifying information coded in a suitable manner. These radio waves are received through the antenna 27 by the control circuits 49, more particularly the receiver/transmitter 25, and they communicate the received information to the processor 15. It compares the information received with information permanently stored in the processor for determining whether the received information is identification information of that hand-held transmitter 51 which is associated with the installation. When there is an agreement the processor 15 provides such signals to the driver circuits 13 and thereby to the semiconductor switches that they allow that a large or high discharge current is drawn from the battery.

FIGS. 3 and 4 illustrate the physical arrangement of the semiconductor switches in the battery. Pole pieces 61 are connected to the positive and negative terminals of two adjoining cells and they have upper, flat surfaces located in the same plane. From these flat surface threaded bolts 63 protrude upwards and their lower portions are moulded in the pole pieces 61. By means of a nut 65 on one bolt 63 both a cooling flange 67 and a mounting plate 69 for the semiconductor switches 11 are attached to one pole piece 61, suitably that pole piece which has a lower potential than the other one, so that the bottom surface of the cooling flange 67 directly rests against the top surface of the pole piece. The cooling flange 67 consists of an elongated rectangular copper plate which is bent to a U-shape having an upper leg projecting above a lower leg. In the lower leg two holes 71 are provided, one of which is used and a bolt 63 passes therethrough for attaching the cooling flange 67 directly to the upper surface of the pole piece 67 with the exterior, bottom surface of its shorter leg. It will provide a good thermal transfer and a good electrical conduction between the pole piece 61 and the cooling flange 67. The other hole 71 can be used for other mounting positions of the flange.

The mounting plate 69 is located partly on top of the lower leg of the cooling flange so that the plate is located between the legs. It has also holes 73 corresponding to the holes 71 of the cooling flange 67, through one of which the same bolt 63 passes, the other hole being used for other mounting positions. The plate 69 has a generally rectangular shape and is like the cooling flange 67 made of a well thermal conducting and electrically conducting material such as copper. By the fact that it partly and over the large part of its bottom side is in a direct contact with the cooling flange 67 also the thermal transfer and the electrical conduction therebetween is good and also to the respective pole piece 67.

The other pole piece 61, which advantageously has a positive polarity, is in the same way, by means of a bolt 63 moulded therein and a nut 75, attached to a bent part 77, which is also made of a conducting material such as aluminium or copper and is in a well conducting contact with the top surface of the pole piece 61. For letting the bolt 63 pass through this part it has two holes 79 corresponding to the holes 71 and 73 of the cooling flange 67 and the mounting plate 69 respectively, one hole used for the actual attachment of the part and the other one allowing a different mounting position. The bent part 77 has generally an exterior rectangular outline but has a deep recess centrally in one of its short sides so that it has a U-shape as seen from above. The legs are bent in their area where they connect to the lower part of the U, so that the legs are located at a higher level than the lower portion of the U. The elevated portions are located on top of the mounting plate 69, above areas at the two long sides thereof. In each one of the elevated leg portions of the bent part 77 two holes 81 are provided, through which threaded screws 83 pass to be mounted in threaded regions in holes 85 placed in corresponding positions in the mounting plate 69. The screws 83 are made of an isolating material, e.g. nylon, and further washers 87 of an isolating material are placed around the screws 83 and between the bent part 77 in the mounting plate 69. In this way the bent part 77 and mounting plate are maintained in a correct position in relation to each other but are electrically isolated from each other.

The semiconductor switches 11, in the case more than one is needed, are attached in two parallel rows and thus along two parallel lines centrally on the mounting plate 69, parallel to its long sides and adjacent the inner edges of the elevated leg portions of the bent part 77, in the embodiment shown eight semiconductor switches being provided divided into two equally large groups, where thus each group comprises four components. At their bottom sides they are electrically connected to the mounting plate 67 by soldering or similar methods and they have also one of their switching terminals located at their bottom sides. The other switching terminals are located in areas on the top side of the components 11, from which electrically conducting wires 89 extend to regions on the elevated portions of the bent part 77. The wires 89 can be attached by means of bonding methods common for exterior electrical connection of electronic integrated circuit chips. The gate terminals of the switches 11 are also located at the top sides thereof and therefrom electrically conducting wires 91 extend to electrically conducting areas 93 on the mounting plate 69. These electrically conducting areas 93 can be conducting layers attached to an isolating substrate, which is in turn bound to the top side of the mounting plate 69, and they are arranged in one row centrally on the mounting plate 69 and there are thus such four such areas. Each electrically conducting terminal area 93 is located centrally between two semiconductor switches 11 and from such switches that are located opposite each other the wires 91 then extend to the same connection area 93.

From each connection area 93 further electrical connecting wires, not shown, extend to the driver circuits 13 illustrated in FIG. 1.

The diodes 24 are connected in an analogous way as the semiconductor switches 11 and are thus mounted with their bottom sides attached in an electrically conducting way to the top surface of the mounting plate 69 at the end edges of the elevated leg portions of the bent part 77. One of the electrodes of the diodes 24 is located on the bottom sides thereof, the other electrodes being located on the top sides thereof, where electrically conducting wires 95 connect them to areas on the elevated leg portions of the bent part 77, which are located at the ends of the leg portions. The temperature sensor 21 for monitoring the semiconductor switches 11 is also attached to the mounting plate 69, e.g. next to the row of the centrally located electrical connecting areas 93. The sensor 21 is connected to the processor 19, see FIG. 1, through a connection wire, not shown.

For access to the bolts 63, in particular for tightening the nuts 69 and 75 thereon, holes 97 are provided in the top leg of the cooling flange 67.

An alternative embodiment of the mounting plates to which the semiconductor switches 11 are attached/connected is illustrated by the exploded perspective view of FIG. 5 and in a state mounted to each other by the perspective view of FIG. 6. The rectangular mounting plate 69 on which the semiconductor switches 11 are mounted in the embodiment according to FIG. 3 and 4, is flat as above but is here replaced with a plate 69' which certainly has the same general exterior outline but which at its short side facing the other plate has a long or deep recess 101, so that it will have a U-shape. The other plate 77' has, differing from the plate or the bent part 77 in the first embodiment, no bent region but is essentially completely flat. It has the shape of a T, where the central leg 103 of the T is intended to be located in the recess 101 in the first plate 69'. The plates 69', 77' have thus complementary profiles as seen from above, so that they when they are placed at each other provide a plate having a substantially rectangular shape, see FIG. 6.

Between the sides in the recess 101 and the sides of the leg 103 of the T there is a gap or interspace, so that the plates are electrically isolated from each other. This interspace is filled by side portions of a distance sleeve 105 made of an isolating material, such as of a suitable plastics or ceramics material. The sleeve 105 has a generally rectangular cross-section and a longitudinal hole 107 passes therethrough receiving the leg 103 of the second mounting plate 77' and it has, on the sides of the hole 107, grooves 109 for receiving the inner edges of the first mounting plate 69', those edges which are located at the recess 101. On the top side the sleeve 105 has rectangular holes 111 close to the longitudinal hole 109. When the sleeve 107 is placed in the recess 101 of the first mounting plate 69' and then the centre leg 103 of the second plate is introduced in the hole 107 of the isolating sleeve 105, these two plates are attached to each other and form one mounting unit.

On the top surface of the first mounting plate 69' also surface coatings are deposited within different surface areas. Thus there are several rectangular areas, e.g. square, areas 113 at the marginal region next to the recess 101 of tin solder for attachment and connection of the semiconductor switches 11. In the embodiment shown there are five such areas adjacent each side of the recess. Further there are elongated areas or connection rims 115 in the neighbourhood of the rectangular tin solder areas 113 and adjacent the exterior long sides of the first mounting plate 77' and these areas 115 can be of thick film type comprising several layers, the bottom layers of which are adhesive and electrically isolating and the top layers can be electrically conducting or form different electrically conducting current paths.

The semiconductor switches 11 can be soldered to the first mounting plate 69' before mounting to the second mounting plate 77'. After the assembly of these parts to each other then the further electrical terminals of the semiconductor switches 11 are connected through wires 89' from the terminals of the switches located on the top surface thereof through the holes 111 in the top side of the sleeve part 105 into and up to the free surface located therein of the second mounting plate 77'. It can, for permitting wire bonding by means of ultra sound of the kind used for connecting integrated circuit plates, be of aluminium. The gate electrodes of the semiconductor switches 11 are connected by means of wires 91' from the top side of the switches 11 to suitable areas on the connection rims 115.

Further elements such as a zener diode connected in parallel to the semiconductor switches and a temperature sensor, not shown, can be placed at the location for one or two semiconductor switches 11. The conductor paths of the connection rims 115 are then modified in the corresponding way so that connection wires can be connected to isolated portions of their top surface.

The mounting plates 69' and 77' comprise mounting holes 73 and 79 respectively in the same way as the mounting plate 69' and the bent part 77 in the first embodiment and can by means of bolts extending through the holes directly be attached to pole pieces of a battery. Below the plate 77', to which the main portion of the switch element 11 is attached, as above a cooling plate or cooling flange 67 can be placed. In that case however, the bottom surfaces of the plates 69' and 77', which are mounted to each other, will extend in the same one plane, and therefore an insert or intermediate part having the same thickness of material as the cooling fin 69 and of a well electrically and thermally conducting material must be placed under the second mounting plate 77'. An alternative is moulding the pole pieces 61, see FIG. 4, to give them different heights.

Figure 7:
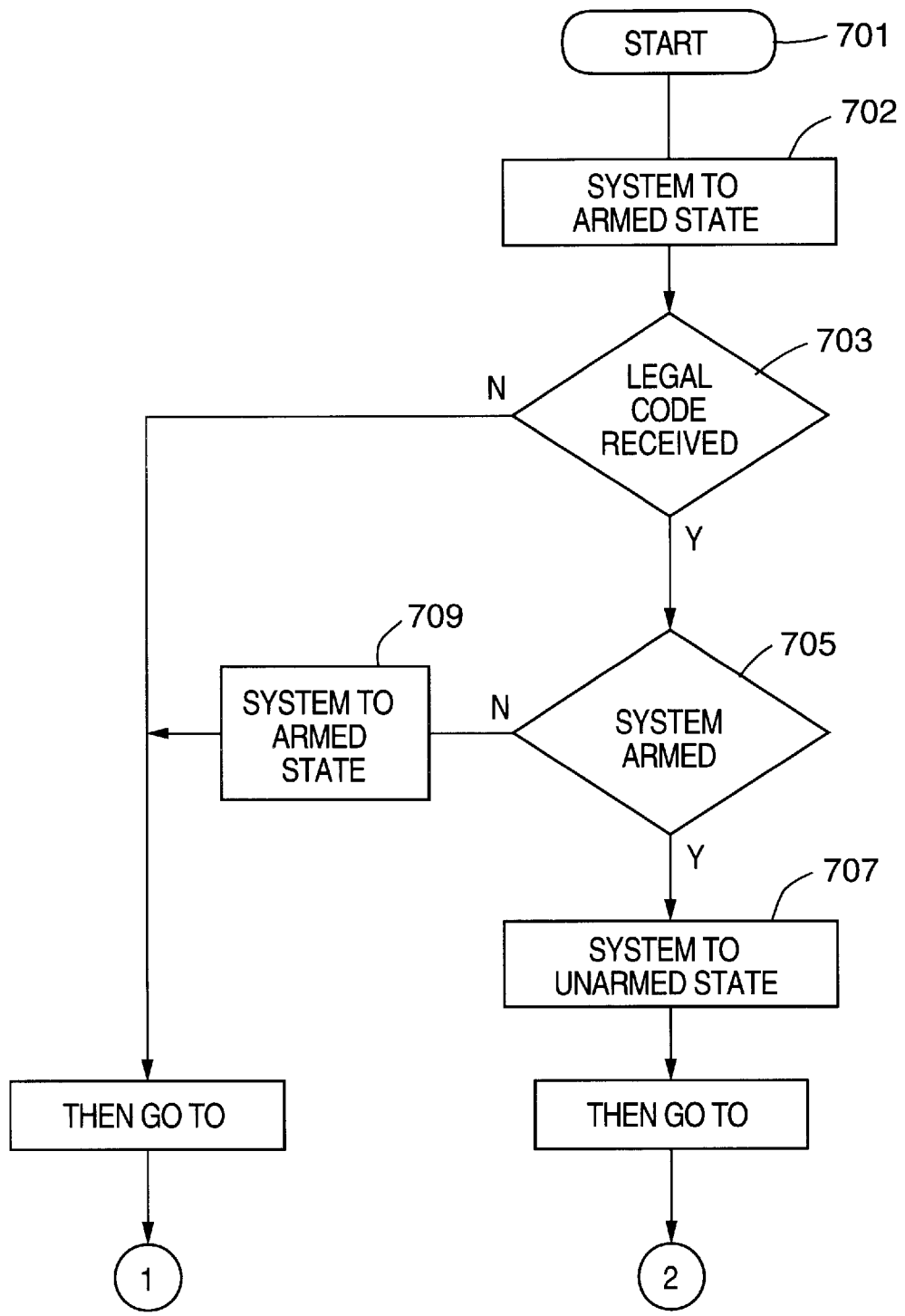
FIGS. 7–9 are flow diagrams of operational steps executed by a processor used in an anti-theft device.
Figure 8:
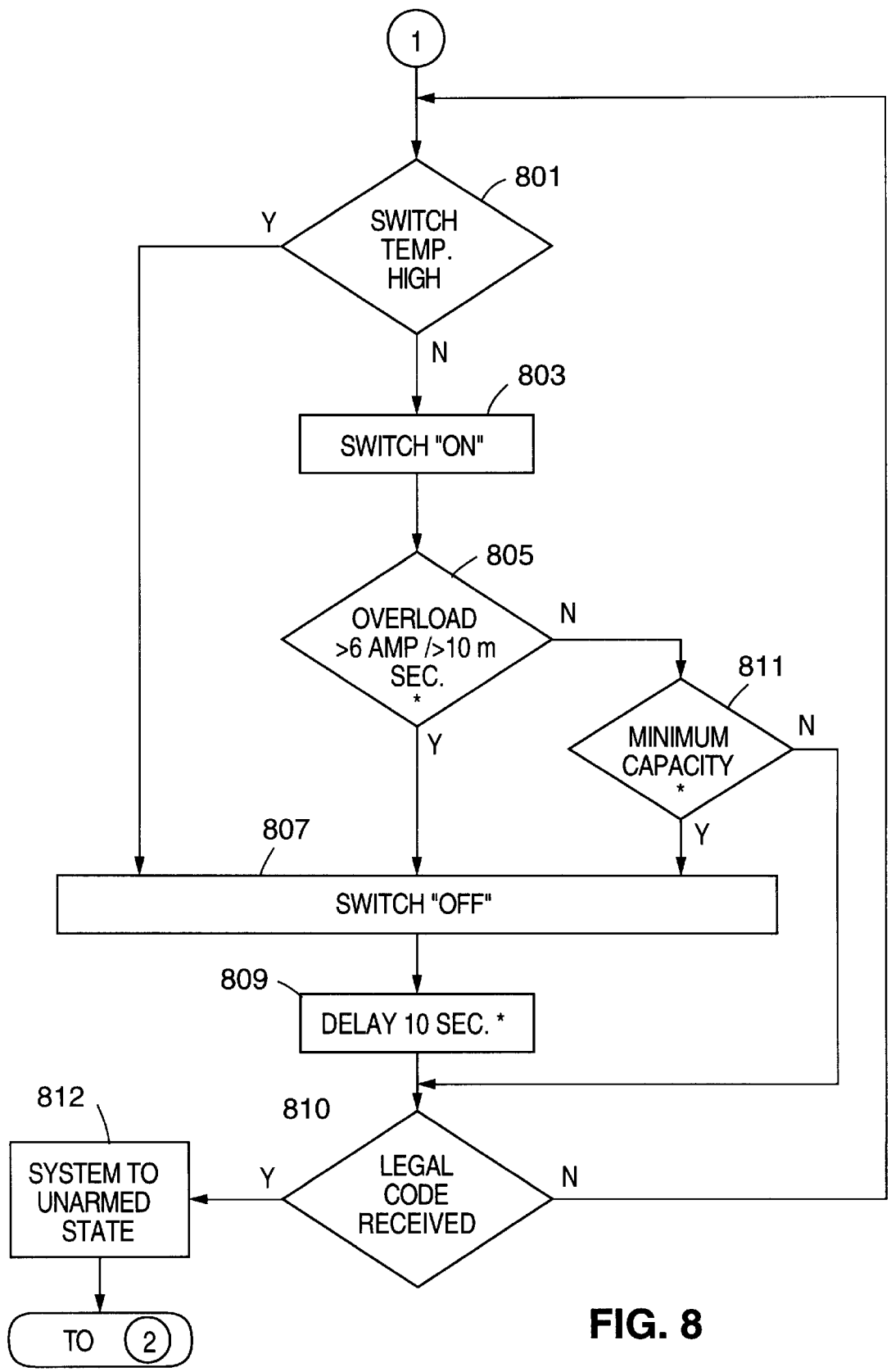
Figure 9:
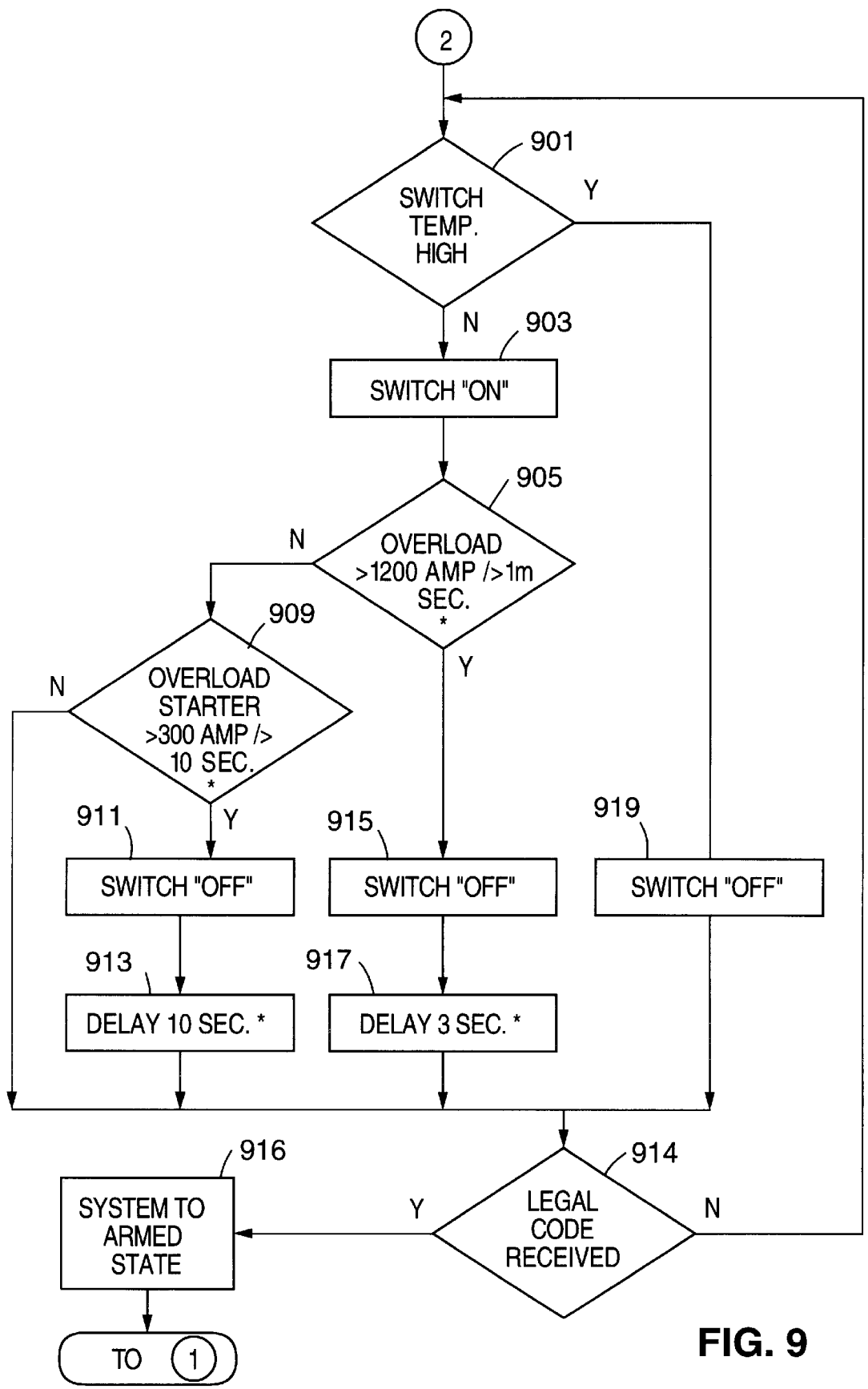

FIGS. 7–9 are flow diagrams illustrating the various steps which are executed by the processor 15. These flow diagrams are executed, first that of FIG. 7 and then one of the flow diagrams of FIGS. 8 and 9. The processor 15 can naturally also be programmed to perform the control of the semiconductor switches 11 so that they are always either in a conducting state or a blocking state and a toggling of the state is made at the reception of a correct identifying signal from the outside. However, a control procedure is preferred which allows that normally a low current is drawn from the battery, also without receiving a correct identifying signal. At reception of a correct code signal the state is changed between this state having a low allowed current and a larger current which is sufficient for e.g. driving an electrical starter motor.

The procedural steps of the flow diagram of the main routine start in FIG. 7 in a start block 701, after which in a block 702 the system is transferred to a locked state, where only small discharge currents are allowed from the battery. Then it is determined in a block 703, whether a correct identifying code has been received. If it is decided that a correct code has been received, it is determined in a block 705, whether the system, i.e. the processor, is in a locked state or not. A locked state means here that the anti-theft function is started and that a start of the starter motor cannot be done, since only low discharge currents can be drawn. If the processor is earlier set to a locked state, it is transferred to an open state in a block 707 and the routine of FIG. 9 is executed, otherwise the system is transferred to a locked state in a block 709 and the routine shown in FIG. 8 is executed. If it was decided in the block 703, that a correct code has not been received, also the routine according to FIG. 8 is performed, which is thus valid all the time when the system is in a locked state.

In the partial procedure shown in the flow diagram of FIG. 8 it is first decided in a block 801, whether the temperature of the switches 11 is too high. It is decided by comparing the signal which arrives from the temperature sensor 21 and which has been converted to digital form to a threshold value. Here also the temperature of the battery itself can be tested by comparing the signal from the temperature sensor 23 to some suitable threshold value. If the temperature is not too high, the switches 11 are allowed to continue to remain in a conductive state or "on-state", which is illustrated by a block 803, after which it is decided in a block 805, whether the current through the battery is larger than a predetermined, rather low value, in a practical example a value equal to 6 A, that is normally a few Amperes, and possible currents exceeding this value have a short duration of time, i.e. last at most a predetermined time, say 10 ms, that is generally a small fraction of a second. If it is the case, a non-permitted high current is drawn during a sufficiently long time for excluding occasional current surges, and probably a try is made to start the vehicle or that some malfunction, e.g. a short-circuit, exists in the electrical system in the vehicle, and then in a block 807 the switches are set to a closed state or "off-state", so that no current at all can be drawn from the battery. This state comprising open or blocking switches 11 is allowed to continue during a predetermined rather long time period, as is illustrated by a block 809, say for example ten or generally a few seconds. Finally it is asked in a block 810, whether a correct identifying signal has been received during the time since it was latest checked. If no correct code has been received, the whole routine of FIG. 8 is performed again starting in the block 801.

If it was decided in the block 810, that a new correct code signal has been received, the system is transferred to its other state, the open state in a block 812, after which the routine of FIG. 9 is executed. If it was decided in the block 805, that only currents below the threshold value are drawn, it is decided in the block 811, whether a state exists where the capacity of the battery is low and where it is not at all allowed to draw any extra current. In order to arrive at this state the processor has decided earlier, by checking the output voltage and the output current of the battery and considering the temperature of the battery by means of the signal from the temperature sensor 23, that the battery capacity is so low that it is only sufficient for starting the motor. The capacity of the battery can be estimated in a known way, e.g. as is described in the U.S. Pat. No. 4,390,841. If this state of a low capacity exists, the procedure continues to the block 807 as above to block the current for a rather long time. In the other case normally a low current is permitted to be drawn and the procedure continues to the block 810 as above for deciding again if a new correct code signal has been received.

In the diagram of FIG. 9 the procedure is shown which is performed when the system is in an opened state, in which larger discharge currents are allowed. In a block 901 it is decided, like in the block 801, whether the temperature of the switches 11 is too high and possibly also, whether the temperature of the whole battery is not too high. If it is not true, the switches 11 are allowed to continue to be in a conductive state or "on-state", as is illustrated by a block 903, and now a start of a vehicle motor by means of an electrically driven starter motor can be done with a large current drawn. However, for avoiding the risk of short-circuits and that extremely high currents are drawn, it is checked in a block 905, whether the current drawn exceeds a large predetermined value, e.g. as is shown in FIG. 9 exceeds 1200 A, that is a value well above that needed normally by the starter motor, e.g. equal to a value of a few times the needed current, and that this is true during a sufficiently long time, say during at least 1 ms, that is during at least a time period of small fraction of a second. In the normal case when it is not true, it is asked in a block 907, whether the current drawn now exceeds the maximum current which is allowed for the starter motor, say as is illustrated in the FIG. 9 exceeds 300 A and whether it is true during a long time period, say a time of at least 10 s, that is a rather long time of several seconds. If it is not true, as in a normal starting try, it is asked in a block 914, whether a new code signal has been received, after it was checked the last time. If it is not the case, the whole routine is executed again and the block 901 is executed again.

If it was decided in the block 916, that a new correct code signal has been received, the system is transferred to a locked state in a block 916, after which the routine of FIG. 8 is performed. If it was decided in the block 909 that a high starting current is drawn during a too long time, there is possibly some malfunction in the starter motor or in any case it can be overheated, so that the switches 11 are brought to a non-conducting state in a block 911 and this state wherein the battery is switched off is then allowed to continue during a rather long time, say during 10 s, that is during a time period of several seconds, as is illustrated by a block 913, after which the block 914 is performed as above. If it was decided in the block 905, that a very large current is drawn from the battery during a not too short time period, the procedure continues to switching off again currents drawn from the battery and that this is allowed to be true during a predetermined, rather long time period, say 3 s or generally a time period of a few seconds which can be shorter, however, than the delay time when only there is an overcurrent drawn by the battery in the block 913, as is illustrated by the blocks 915 and 917. After that the block 914 is executed as above. If it was decided in the block 901, that the temperature of the switches is too high, the battery is switched off again and the switches are set to a non-conducting state, as is illustrated by a block 919, after which the block 914 is performed as above.

Figure 10:
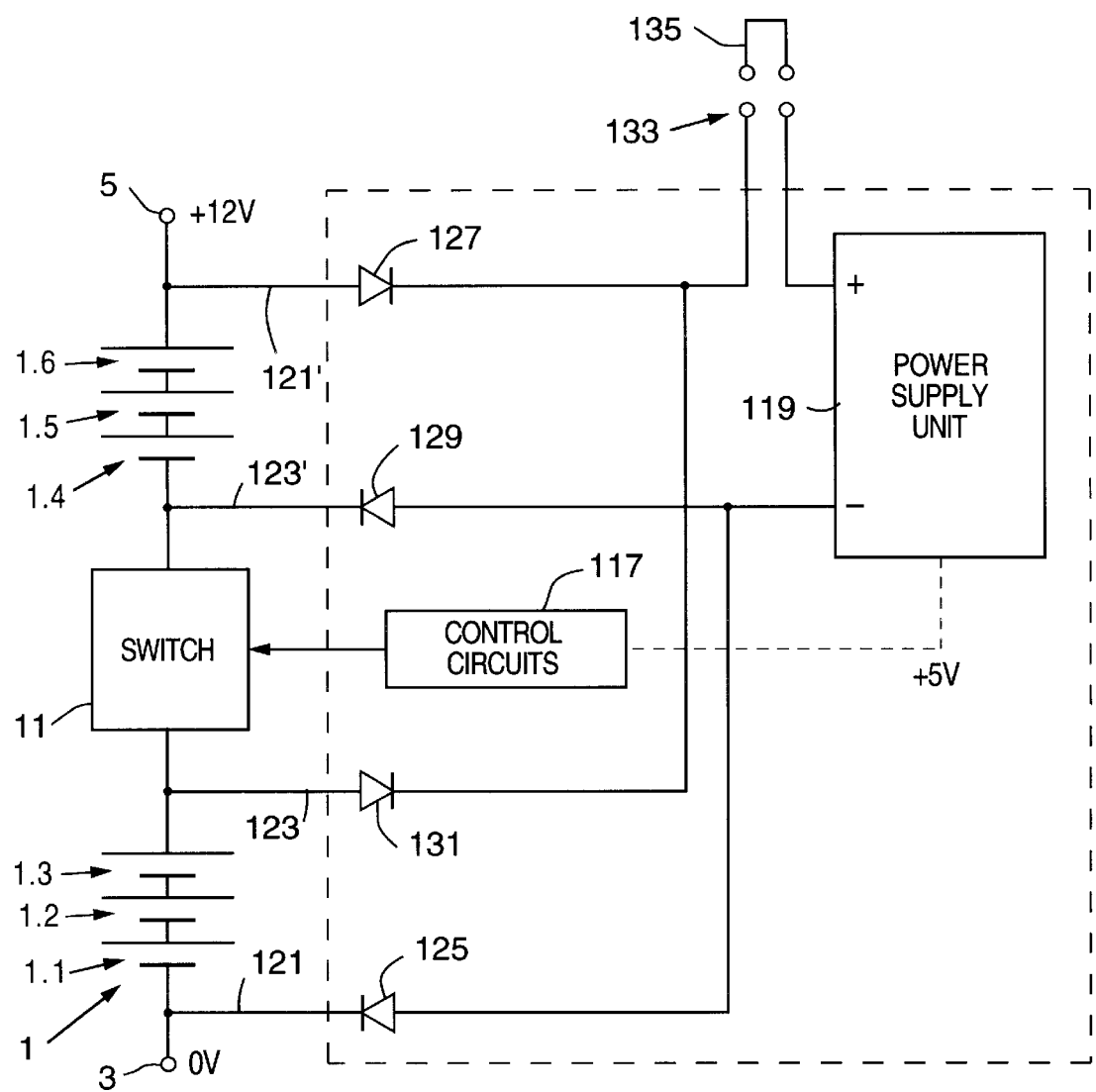
FIG. 10 is an electrical circuit diagram illustrating the power supply to control circuits of the anti-theft device.

FIG. 10 is a schematic circuit diagram of an anti-theft battery. Preferably it is a lead-acid battery having six battery cells 1 connected in series. The voltage provided by the battery between the exterior or outermost terminals 3 and 5 thereof is then nominally 12 V. The electronic circuits for controlling the switches 11 comprise the processor 15, drivers 13, rf-receiver/transmitter and interfaces, here all included in an electronics circuit block 117.

For powering the electronic control circuits 117 a controlled power is required, e.g. for supplying a voltage of 5 V. Therefor a power supply unit 119 is arranged which at its output terminals provides a controlled direct voltage. The power supply unit 119 in turn receives the energy necessary for the operation thereof normally from the exterior terminals 3 and 5 of the battery through leads 121, 121'. For ensuring a power supply, also when the switches 15 are blocking and no current can pass through the battery and as an extra security, the power supply unit can also obtain a reduced voltage through leads 123, 123' extending from the negative and positive terminals of the switches 11. The leads 121, 121' to the exterior battery terminals 3, 5 can be rather long and in addition they may attached by means of screws, so that some risk may exist for the occurrence of an interrupt of the voltage supply from the exterior terminals 3, 5. For an interrupt in either one of these leads 121, 121' the power supply unit 119 is supplied only from three battery cells, i.e. with a voltage of about 6 V. In addition, if the switch 15 is in the "off-state", the power supply unit 119 also obtains a voltage of 6 V but in this case in parallel from two separated groups of each three cells, the three most negative cells 1.1, 1.2, 1.3 and the three most positive cells 1.4, 1.5, 1.6.

To achieve such a supply to the power supply unit 119 four diodes having a suitable polarity are connected in the leads 121, 121' and 123, 123'. Thus a first diode 125 is connected in the line 121 to the negative external terminal 3 and has its negative electrode connected to this terminal 3. In the same way a diode 127 is connected in the fine 121' to the positive external terminal 5 and its positive electrode is connected to this external terminal 5. In the line 123', which connects the positive electrodes of the switches 11 to the electronic circuits block 117, a diode 129 is connected, the negative electrode of which is connected to the plus-side of the switches 11 or generally to the negative terminal of the fourth battery cell 1.4. Finally a diode 131 is connected in the lead 123 to the negative side of the switches 11. This diode 123 has its positive electrode connected to the negative side of the switches 11, or equivalently to the positive terminal of the third battery cell 1.3.

If an interrupt would occur in the lead 121', which extends from the positive external terminal 5 to the power supply unit 119, it obtains its supply voltage from the three first battery cells 1.1, 1.2 and 1.3. In the corresponding way, for an interrupt in the lead 121 from the negative external terminal 3, the power supply unit 119 obtains its supply voltage from the three most positive cells of the battery, i.e. the cells 1.4, 1.5 and 1.6.

An interrupt place, which is accessible from the outside, is advantageously provided for the power supply of the electronic circuits 117, as is indicated in FIG. 10 by two contact tongues 133, which are connected in a power supply line at a location very near the power supply unit 119. When storing the battery there is no connection between these contact tongues 133, so that the electronic circuits 117 will then not draw any current from the battery. The contact tongues 133 can, when the battery is to be used, be closed by means of a suitably constructed contact metal strap or jumper, indicated at 135.

We claim:

1. An electrically controlled switch device, comprising:
   a) at least one semiconductor switch, wherein the one or more semiconductor switches each comprise a main body having a first switch terminal located on a bottom side, a second switch terminal located on a top side and a control terminal;
   b) a first electrical terminal comprising a first electrically and thermally conducting plate-shaped member comprising a first side wherein the main bodies of the switches are mounted in a line on the first side of the first electrically and thermally conducting plate-shaped member, so that the bottom sides of the switches are in electrical and intimate thermal contact with the first side of the first electrically and thermally conducting plate-shaped member;
   c) a second electrical terminal comprising a second electrically conducting plate-shaped member comprising two sides and an edge, wherein the edge is located in parallel to the line of the switches and at the switches, the second member being attached to form a gap between the first and second members having an essentially constant width; and
   d) electrical connection leads coupled between the second switch terminals and the second electrically conducting plate-shaped member.

2. The switch device of claim 1, wherein the edge of the second electrically conducting plate-shaped member is located above an inner portion of the first side of the first electrically and thermally conducting plate-shaped member, and further wherein a gap is formed between a bottom side of the second electrically conducting plate-shaped member and the first side of the first electrically and thermally conducting plate-shaped member.

3. The switch device of claim 1, wherein the switches are divided into a first and a second group of switches, wherein the first and second groups of switches each comprise at least one switch, and further wherein the switches of each group are positioned in a line parallel and adjacent to a first and a second edge of the second electrically conducting plate-shaped member.

4. The switch device of claim 3, further comprising strips of an electrically isolated material that have electrically conducting areas thereon and are located between a line through the switches and between the switches of the first group and the second group, wherein the electrical connection leads are arranged between the first and second switch terminals and the conducting areas.

5. The switch device of claim 1, wherein the second electrically conducting plate-shaped member has a U-shape formed by two parallel legs extending from a base, and further wherein two parallel edges are located at the interior portions of the two parallel legs adjacent to which the switches are arranged.

6. The switch device of claim 5, wherein the first electrically and thermally conducting plate-shaped member has a projecting portion which protrudes between the two parallel legs of the U-shape of the second electrically conducting plate-shaped member and comprises two parallel edges which are adjacent to the switches.

7. The switch device of claim 1, wherein the gap is filled with an electrically isolating material.

8. The switch device of claim 1, further comprising a sleeve of an electrically isolating material for enclosing a portion of the second electrically conducting plate-shaped member and filling the gap.

9. The switch device of claim 8, wherein the sleeve comprises apertures to permit access to a side of the second electrically conducting plate-shaped member by the electrical connection leads.

10. The switch device of claim 1, wherein the first electrically and thermally conducting plate-shaped member is prolonged by a cooling flange.

11. The switch device of claim 10, wherein the cooling flange is a separate element from the first electrically and thermally conducting plate-shaped member which at one of its sides is in thermal contact with a first side of the first electrically and thermally conducting plate-shaped member.

12. A battery having a built-in protection against theft comprising:
   a) an electrically controllable switch device having at least two switches which are connected in parallel; and
   b) two adjacent series connected battery cells wherein the electrically controllable switch device comprises wherein the switch device is connected between the battery cells.

13. The battery of claim 12, wherein the electrically controllable switch device further comprises:
   a) at least two semiconductor switches wherein the one or more switches each comprise a main body and having a first switch terminal located on a bottom side and a second switch terminal located on a top side;
   b) a first electrical terminal comprising a first electrically and thermally conducting plate-shaped member comprising a first side wherein the main body of the switches are mounted along a line on the first side of the first electrically and thermally conducting plate-shaped member, so that the bottom sides of the switches are in an electrical and intimate thermal contact with the first electrically and thermally conducting plate-shaped member;
   c) a second electrical terminal comprising a second electrically conducting plate-shaped member comprising two sides and an edge, wherein the edge is located in parallel to the line of the switches and adjacent to the switches, the second electrically conducting plate-shaped member coupled to form a gap having an essentially consistent width between the first and second members; and
   d) electrical connection leads coupled between the second switch terminals and the second electrically conducting plate-shaped member.

14. The battery according to claim 12, wherein the switch device further comprises:
   a) at least two semiconductor switches wherein the two or more switches each comprise a main body and having a first switch terminal located on a bottom side and a second switch terminal located on the top side;
   b) a first electrical terminal comprising a first electrically and thermally conducting plate-shaped member comprising two large sides and an edge wherein the main body of the switches are mounted on a side of the first electrically and thermally conducting plate-shaped member and adjacent to the edge, so that the bottom sides of the switches are in an electrical and intimate thermal contact with the first electrically and thermally conducting plate-shaped member;

c) a second electrical terminal comprising a second electrically conducting plate-shaped member comprising two sides and an edge wherein the edge extends parallel and adjacent to the edge of the first electrically and thermally conducting plate-shaped member, at which the switches are mounted, a gap being formed between the parallel portions of the edges; and d) electrical connection leads coupled between the second switch terminals and a large side of the second electrically conducting plate-shaped member.

15. The battery of claim 13, wherein each of the cells comprises a positive and a negative battery plate with one of the battery plates coupled to the first electrical terminal and the other battery plate coupled to the second electrical terminal.

16. The battery of claim 15, wherein the first electrical terminal comprises an upstanding pole post which is prolonged laterally by a pole piece.

17. A battery having adjacent cells and comprising a built-in anti-theft device, the anti-theft device comprising:

a) at least one electrically controllable semiconductor switch connected between at least one pair of adjacent cells in the battery; and b) at least one diode connected in parallel to the one or more semiconductor switches, the one or more diodes having such a polarity that when the battery is charged from an exterior voltage source, the one or more diodes become forward-biased to allow current through the one or more diodes, and when the battery is in normal use for powering exterior devices, the one or more diodes become reverse-biased and impede current flow through the one or more diodes, such that current flows only through the one or more semiconductors.

18. A battery having at least two series connected cells and a built-in anti-theft device wherein the built in anti-theft device comprises:

a) at least one electrically controllable switch connected between the two adjacent series connected cells in the battery;

b) a first temperature sensor arranged in thermal proximity to the one or more electrically controllable switches and for providing an electrical signal dependent on a temperature of the one or more electrically controllable switches; and c) a control unit arranged for controlling the one or more electrically controllable switches and for receiving a signal from the first temperature sensor, wherein the control unit compares the signal from the first temperature sensor to a first threshold value and for switching off the electrically controllable switches upon a predetermined value.

19. The battery of claim 18, further comprising a thermally conducting plate comprising a first side wherein the main body of the switches are attached to the first side, so that a bottom side of the switches is in an intimate thermal contact with the first side of the thermally conducing plate; and further wherein the first temperature sensor is also attached to the thermally conducing plate in an intimate thermal contact therewith.

20. The battery of claim 18, further comprising a second temperature sensor arranged remote from the switches for providing an electrical signal dependent on an overall temperature of the battery, and further wherein the control unit is configured to receive the electrical signal from the second temperature sensor and for comparing the signal from the second temperature sensor to a first threshold value and for switching off the controllable switches if the electric signal from the second temperature sensor is greater than the first threshold value.

21. A motor vehicle battery having a built-it protection device wherein the protection device comprises:

a) an electrically controllable switch device connected in series with the motor vehicle battery;

b) means for controlling the controllable switch device;

c) means for measuring a magnitude of an electrical current, which passes through the motor vehicle battery, and the voltage over terminals of the battery;

d) means for determining a remaining charge of the motor vehicle battery from the electrical current and voltage of the motor vehicle battery; and e) means for placing the switch device in a blocking state, when a remaining charge in the motor vehicle battery is lower than a first threshold value, the first threshold value chosen so that the motor vehicle battery has sufficient charge for starting the motor vehicle, wherein the motor vehicle battery is electrically connected to a starter motor of a motor vehicle and to other electrically driven apparatus permanently connected to the motor vehicle.

22. The battery of claim 21, wherein the protection device further comprises:

a) means for receiving a code signal; and b) means for placing the switch device in a conducting state at reception of the code signal.

23. The battery of claim 22 wherein the protection device further comprises:

a). means for measuring a magnitude of an electrical current in the motor vehicle battery when the switch device is placed in the conducting state; and b) means for placing the switch device in a blocking state when a measured electrical current exceeds a first threshold value.

24. The battery of claim 22, wherein the protection device further comprises:

a) means for measuring a magnitude of an electrical current in the motor vehicle battery when a particular code signal has not been received; and b) means for placing the switch device in a blocking state when the measured electrical current exceeds a second threshold value.

25. A battery system comprising a) a battery;

b) an electrically controllable switch device connected in series with the battery; and c) a control unit having:
  i) means for measuring a magnitude of an electrical current, which passes through the battery;
  ii) means for placing the switch device in a blocking state during a first predetermined time when the electrical current through the battery exceeds a first threshold value;
  iii) means for receiving a code signal;

iv) means for placing the switch device in a conducting state at reception of the code signal even when the electrical current through the battery exceeds the first threshold value;
v) means for measuring the magnitude of the electrical current passing through the battery when the switch device is placed in a conducting state after receiving the code signal; and
vi) means for placing the switch device in a blocking state during a second predetermined time when the measured electrical current exceeds a second threshold value which is larger than the first threshold value, wherein the control unit is coupled to the electrically controllable switch.

26. The battery of claim 25 wherein the first threshold value is less than an amount necessary for starting a motor of a vehicle.

* * * * *